United States Patent
Dong

(10) Patent No.: US 12,078,930 B2
(45) Date of Patent: Sep. 3, 2024

(54) PHOTORESIST FEEDING DEVICE

(71) Applicant: CHANGXIN MEMORY TECHNOLOGIES, INC., Anhui (CN)

(72) Inventor: Bizhi Dong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 468 days.

(21) Appl. No.: 17/444,112

(22) Filed: Jul. 30, 2021

(65) Prior Publication Data

US 2021/0356867 A1 Nov. 18, 2021

Related U.S. Application Data

(63) Continuation of application No. PCT/CN2021/076089, filed on Feb. 8, 2021.

(30) Foreign Application Priority Data

Feb. 18, 2020 (CN) .......................... 202010098934.9

(51) Int. Cl.
*G03F 7/16* (2006.01)
*G03F 7/20* (2006.01)

(52) U.S. Cl.
CPC ...................... *G03F 7/16* (2013.01)

(58) Field of Classification Search
CPC ... G03F 7/16; G03F 7/20; B05C 11/10; B01D 19/0078; F04F 1/14; F04F 137/209; H01L 21/67017

(Continued)

(56) References Cited

U.S. PATENT DOCUMENTS 6,176,252 B1 * 1/2001 Peng .......................... G03F 7/16
96/219
9,480,938 B2 11/2016 Jacobson
(Continued)

FOREIGN PATENT DOCUMENTS

CN 101276159 A 10/2008
CN 202087088 U 12/2011
(Continued)

OTHER PUBLICATIONS

International Search Report in the international application No. PCT/CN2021/076089, mailed on Apr. 26, 2021.
(Continued)

*Primary Examiner* — Robert A Hopkins
*Assistant Examiner* — Qianping He
(74) *Attorney, Agent, or Firm* — Syncoda LLC; Feng Ma

(57) ABSTRACT

A photoresist feeding device includes a cleaning member and a storage member. The cleaning member includes a first photoresist inlet and a first photoresist outlet. The storage member includes a second photoresist inlet and a second photoresist outlet. The first photoresist outlet is connected with the second photoresist inlet. An ultrasonic generator is arranged in the cleaning member, and the ultrasonic generator is configured to generate ultrasonic waves for separating bubbles of a photoresist solution in the cleaning member from the photoresist solution, and for gathering impurity particles in the photoresist solution. The storage member is configured to store the photoresist solution that has been subjected to ultrasonic treatment.

11 Claims, 5 Drawing Sheets

(58) Field of Classification Search
USPC .............................................. 96/175; 95/262
See application file for complete search history.

(56) References Cited

U.S. PATENT DOCUMENTS

| | | | |
|---|---|---|---|
| 9,731,226 | B2 | 8/2017 | Yoshihara et al. |
| 9,878,267 | B2 | 1/2018 | Yoshihara et al. |
| 10,022,652 | B2 | 7/2018 | Yoshihara et al. |
| 2004/0187891 | A1* | 9/2004 | Chou ........................ B08B 3/12 134/1 |
| 2015/0000517 | A1* | 1/2015 | Yoshihara ................. G03F 7/16 95/1 |
| 2015/0079518 | A1 | 3/2015 | Jacobson |
| 2017/0296944 | A1 | 10/2017 | Yoshihara et al. |
| 2018/0093205 | A1 | 4/2018 | Yoshihara et al. |

FOREIGN PATENT DOCUMENTS

| | | |
|---|---|---|
| CN | 104137225 A | 11/2014 |
| CN | 204953432 U | 1/2016 |
| CN | 105413247 A | 3/2016 |
| CN | 205334053 U | 6/2016 |
| CN | 106990674 A | 7/2017 |
| CN | 110787967 A | 2/2020 |
| JP | S5670635 A | 6/1981 |
| JP | 2004181347 A | 7/2004 |
| KR | 20040062279 A | 7/2004 |

OTHER PUBLICATIONS

First Office Action of the Chinese application No. 202010098934.9, issued on Feb. 16, 2022.
Second Office Action of the Chinese application No. 202010098934.9, issued on Jul. 15, 2022.

* cited by examiner

PHOTORESIST FEEDING DEVICE

CROSS-REFERENCE TO RELATED APPLICATIONS

This is a continuation of International Patent Application No. PCT/CN2021/076089 filed on Feb. 8, 2021, which claims priority to Chinese Patent Application No. 202010098934.9 filed on Feb. 18, 2020. The disclosures of these applications are hereby incorporated by reference in their entirety.

BACKGROUND

In semiconductor manufacturing process, a photoetching process is one of the key steps in the process of manufacturing integrated circuit, and the stability and reliability of the photoetching have an important impact on the quality of products.

SUMMARY

The present disclosure relates generally to the technical field of semiconductors, and more specifically to a photoresist feeding device.

Embodiments of the present disclosure provide a photoresist feeding device so as to reduce the bubbles and impurity particles in photoresist output by the photoresist feeding device.

An embodiment of the present disclosure provides a photoresist feeding device, including a cleaning member and a storage member. The cleaning member includes a first photoresist inlet and a first photoresist outlet; the storage member includes a second photoresist inlet and a second photoresist outlet. The first photoresist outlet is connected with the second photoresist inlet. An ultrasonic generator is arranged in the cleaning member. The ultrasonic generator is configured to generate ultrasonic waves for separating bubbles of a photoresist solution in the cleaning member from the photoresist solution, and for gathering impurity particles in the photoresist solution. The storage member is configured to store the photoresist solution that has been subjected to ultrasonic treatment.

DETAILED DESCRIPTION

Figure 1:
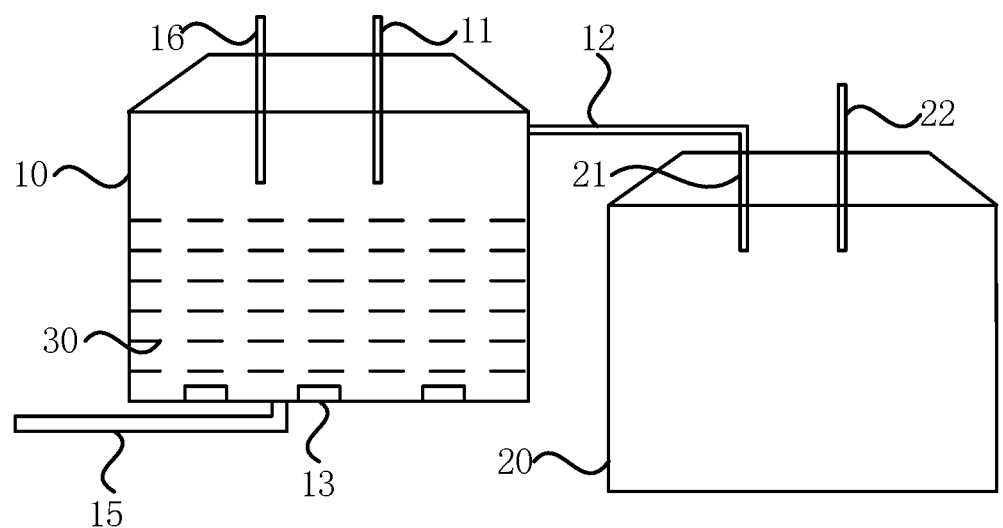
FIG. 1 illustrates a schematic view of a photoresist feeding device according to an example of the present disclosure.

The present disclosure is further described in detail with reference to drawings and embodiments. It should be understood that the specific embodiments described herein are only used to explain the present disclosure, not to limit the present disclosure. In addition, it should be noted that for the convenience of description, only some but not all structures related to the present disclosure are shown in the drawings.

According to a photoetching process, photoresist is first applied onto a wafer by a photoresist feeding device to form a photoresist film, then parallel light is irradiated on the photoresist film through a mask to expose the photoresist film to the light, and finally developing liquid is used to perform a develop step to complete pattern transfer. However, photoresist output by an existing photoresist feeding device is often doped with bubbles and impurity particles. When the photoresist output by the photoresist feeding device contains the bubbles and the impurity particles, it will make the photoresist coated on the wafer inhomogeneous, which results in yield reduction.

FIG. 1 is a schematic view of a photoresist feeding device according to an example of the present disclosure. As shown in FIG. 1, the photoresist feeding device includes a cleaning member 10 and a storage member 20. The cleaning member 10 includes a first photoresist inlet 11 and a first photoresist outlet 12, the storage member 20 includes a second photoresist inlet 21 and a second photoresist outlet 22. The first photoresist outlet 12 is connected with the second photoresist inlet 21. An ultrasonic generator 13 is arranged in the cleaning member 10. The ultrasonic generator 13 is configured to generate ultrasonic waves, to separate bubbles of a photoresist solution 30 in the cleaning member 10 from the photoresist solution 30, and to gather together the impurity particles in the photoresist solution 30. The storage member 20 is configured to store the photoresist solution 30 that has been subjected to ultrasonic treatment.

As shown in FIG. 1, a shape of the cleaning member 10 may include, for example, a square groove which is provided with a containing cavity for containing the photoresist solution 30 and arranging the ultrasonic generator 13. However, the embodiment of the present disclosure does not specifically limit the shape of the cleaning member 10, as long as the ultrasonic generator 13 and the photoresist solution 30 may be arranged in the cleaning member. As shown in FIG. 1, a shape of the storage member 20 may include, for example, a square groove. However, the embodiment of the present disclosure does not specifically limit the shape of the storage member 20, as long as the photoresist solution 30 may be stored in the storage member. Specifically, the first photoresist inlet 11 is configured to input the photoresist solution 30 to be subjected to ultrasonic treatment. At this time, the photoresist solution 30 is often mixed with the bubbles and the impurity particles, which will affect the effect of a subsequent coating and affect yield of products. According to the photoresist feeding device according to the embodiment of the present disclosure, the ultrasonic generator 13 in the cleaning member 10 generates the ultrasonic wave. On one hand, the bubbles of the photoresist solution 30 entering into the cleaning member 10 are separated from the photoresist solution 30 due to a cavitation effect of the ultrasonic waves in the photoresist solution 30. On the other hand, due to gather effect of the ultrasonic waves in the photoresist solution 30, the impurity particles in the photoresist solution 30 gather together to form larger particles which are deposited at the bottom of the cleaning member 10 under the action of gravity. In this way, a cleaner photoresist solution 30 is obtained.

Further, the obtained cleaner photoresist solution 30 is output through the first photoresist outlet 12 of the cleaning member 10, and then enters into the storage member 20 through the second photoresist inlet 21 of the storage member 20 for storage. That is, purification and storage of the photoresist solution are separated, so that the problem that the photoresist solution 30 in the cleaning member 10 still contains more bubbles and impurity particles caused by outputting the photoresist solution 30 before ultrasonic treatment is completed is avoided. Meanwhile, the photoresist solution 30 may be further fully deposited in the storage member 20, that is, even if the impurity particles are not completely deposited in the cleaning member 10, the impurity particles may be further fully deposited in the storage member 20 at a bottom of the storage member 20 to obtain the cleaner photoresist solution 30. As such, the photoresist solution 30 coated on an object to be coated is more homogeneous, and the yield of the products is improved.

In conclusion, in the photoresist feeding device according to the embodiment of the present disclosure, the ultrasonic generator in the cleaning member generates the ultrasonic waves which separate the bubbles of the photoresist solution in the cleaning member from the photoresist solution, and gather the impurity particles in the photoresist solution to deposit them at the bottom of the cleaning member, so that cleaner photoresist is obtained. Meanwhile, since the photoresist feeding device further includes the storage member which stores the photoresist solution that has been subjected to ultrasonic treatment, the problem that the photoresist solution output by the photoresist feeding device still contains more bubbles and impurity particles caused by outputting the photoresist solution before ultrasonic treatment is completed is avoided, which further makes the output photoresist cleaner, makes the photoresist solution coated on the object to be coated more homogeneous, and further improves the yield of the products. In addition, compared with a filter in the related art which is configured to filter the bubbles of the photoresist solution and adsorb the impurity particles in the photoresist, the photoresist feeding device according to the embodiment may avoid the problem that a large amount of photoresist solution is consumed during removing the bubbles and adsorbing the impurity particles through the filter, and thus the waste of the photoresist solution is reduced, and the production cost is lower.

In one example, as shown in FIG. 1, the first photoresist outlet 12 is located at a top end of the cleaning member 10, and the second photoresist outlet 22 is located at a top end of the storage member 20.

Figure 2:
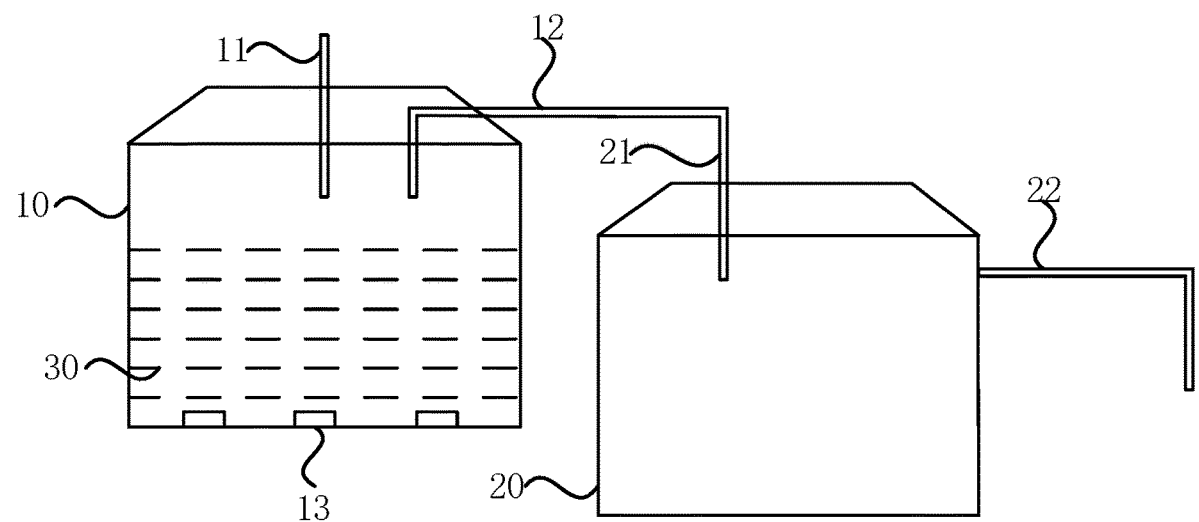
FIG. 2 illustrates a schematic view of a photoresist feeding device according to another example of the present disclosure.

The top end of the cleaning member 10 may be an upper part of a side wall of the cleaning member 10, as shown in FIG. 1. The top end of the cleaning member may also be located on a top surface of the cleaning member 10, as shown in FIG. 2. FIG. 2 is a schematic view of photoresist feeding device according to another example of the present disclosure. A top end of the storage member 20 may be located on the top surface of the cleaning member 10, as shown in FIG. 1, and may also be an upper part of the side wall of the storage member 20, as shown in FIG. 2.

Specifically, since the impurity particles are gathered at the bottom of the cleaning member 10 and are also deposited at the bottom of the storage member 20 after the further deposition in the storage member 20, the photoresist solution 30 at the upper part of the cleaning member 10 and the upper part of the storage member 20 is cleaner. According to the embodiment, by arranging the first photoresist outlet 12 at the top end of the cleaning member 10 and arranging the second photoresist outlet 22 at the top end of the storage member 20, the final output photoresist solution 30 is cleaner, and the photoresist solution 30 coated on the object to be coated is more homogeneous, so that the yield of the products is improved.

Figure 3:
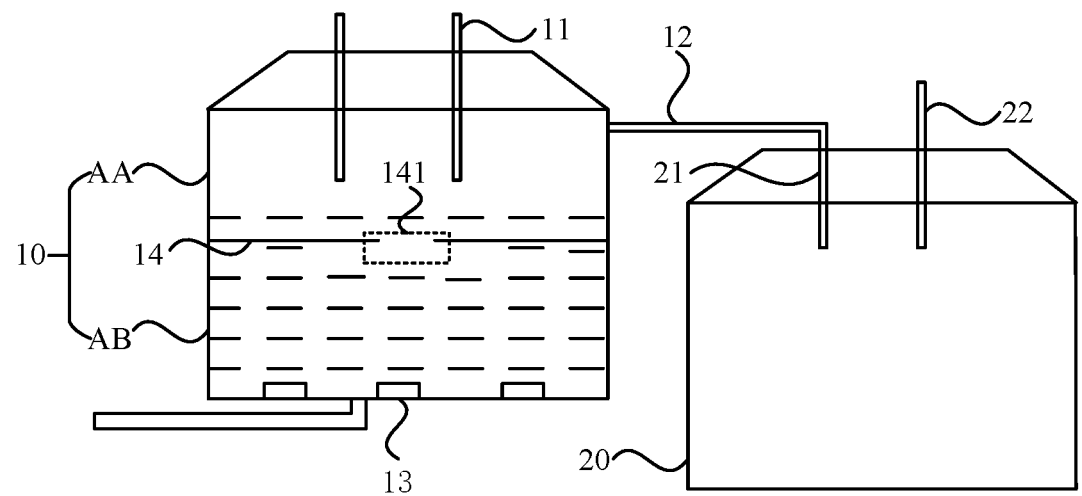
FIG. 3 illustrates a schematic view of a photoresist feeding device according to another example of the present disclosure.

FIG. 3 is a schematic view of a photoresist feeding device according to another example of the present disclosure. In one example, as shown in FIG. 3, the cleaning member 10 is further provided with a partition member 14 including at least one hollow structure 141. The partition member 14 divides a containing cavity of the cleaning member 10 into a first region AA and a second region AB. The first region AA and the second region AB are arranged along a direction perpendicular to a bottom of the cleaning member 10.

The impurity particles that have been deposited on the bottom of the cleaning member 10 may move back to the upper part of the cleaning member 10 when the ultrasonic waves are applied, which would affect quality of the photoresist solution 30 input into the storage member 20. According to the present embodiment, the partition member 14 is arranged in the cleaning member 10. The partition member 14 includes at least one hollow structure 141. The photoresist solution 30 enters into the second region AB through the hollow structure 141 in the partition member 14. Meanwhile, through the hollow structure 141, the photoresist solution 30 in the first region AA can be subjected to ultrasonic treatment, and the impurity particles are blocked by an area of the partition member 14 where the hollow structure 141 is absent, so that the problem that the impurity particles deposited at the bottom of the cleaning member 10 move back to the upper part of the cleaning member 10 during ultrasonic treatment can be avoided, and therefore it is possible to avoid impurities affecting the quality of the photoresist solution 30 input into the storage member 20.

In one example, the partition member 14 may include, for example, one hollow structure 141, as shown in FIG. 3; and the partition member 14 may also include a plurality of hollow structures 141, which are not shown in the drawings. The embodiment is not specifically limited to this, as long as the impurity particles that have been deposited on the bottom of the cleaning member 10 may be prevented from moving back to the upper part of the cleaning member 10 when the ultrasonic waves are applied, and the ultrasonic treatment on the photoresist solution 30 in the first region AA is not affected.

In one example, as shown in FIG. 3, an area of the hollow structure is S1, and an area of the partition member is S2, and $S1=(1/4)S2$.

In one example, when the area of the hollow structure is S1, the area of the partition member is S2 and $S1=(1/4)S2$, on one hand, an ultrasonic effect in the photoresist solution 30 in the first region AA will not be affected, on the other hand, the impurity particles may be blocked by the area the partition member 14 where the hollow structure 141 is absent, so that the problem that the impurity particles deposited at the bottom of the cleaning member 10 move back to the upper part of the cleaning member 10 during ultrasonic treatment can be avoided, and therefore it is possible to avoid impurities affecting the quality of the photoresist solution 30 input into the storage member 20.

Figure 4:
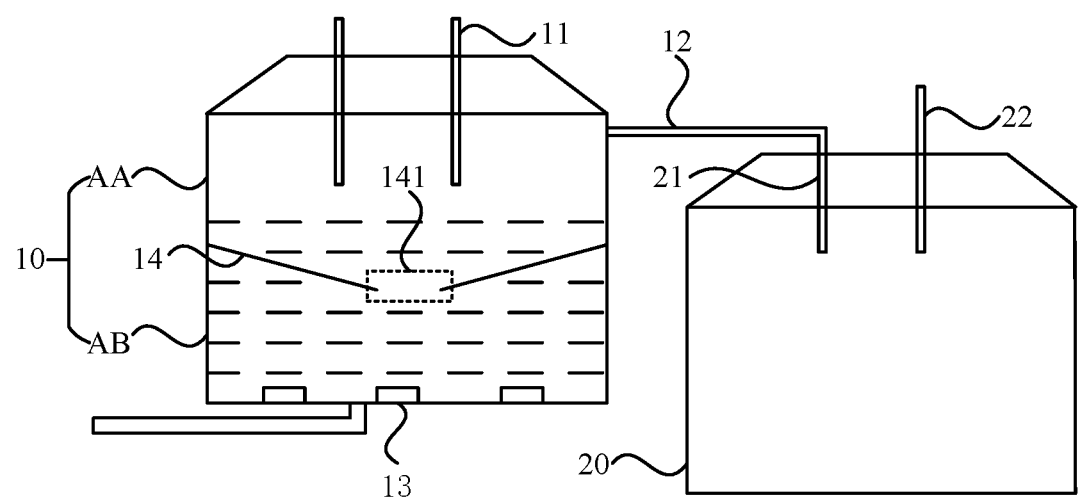
FIG. 4 illustrates a schematic view of a photoresist feeding device according to another example of the present disclosure.

FIG. 4 is a schematic view of a photoresist feeding device according to another example of the present disclosure. In one example, as shown in FIG. 4, the partition member 14 is in a funnel-shape, and a central region of the partition member 14 protrudes toward the bottom of the cleaning member 10.

Specifically, according to the present example, the partition member 14 is in the funnel-shape, so that the impurity particles in the photoresist solution 30 in the first region AA are gathered together to form larger particles after ultrasonic treatment, and the larger particles are rapidly deposited on the bottom of the cleaning member 10 under the action of gravity, so that the larger particles are prevented from gathering at an corner of the partition member 14.

Figure 5:
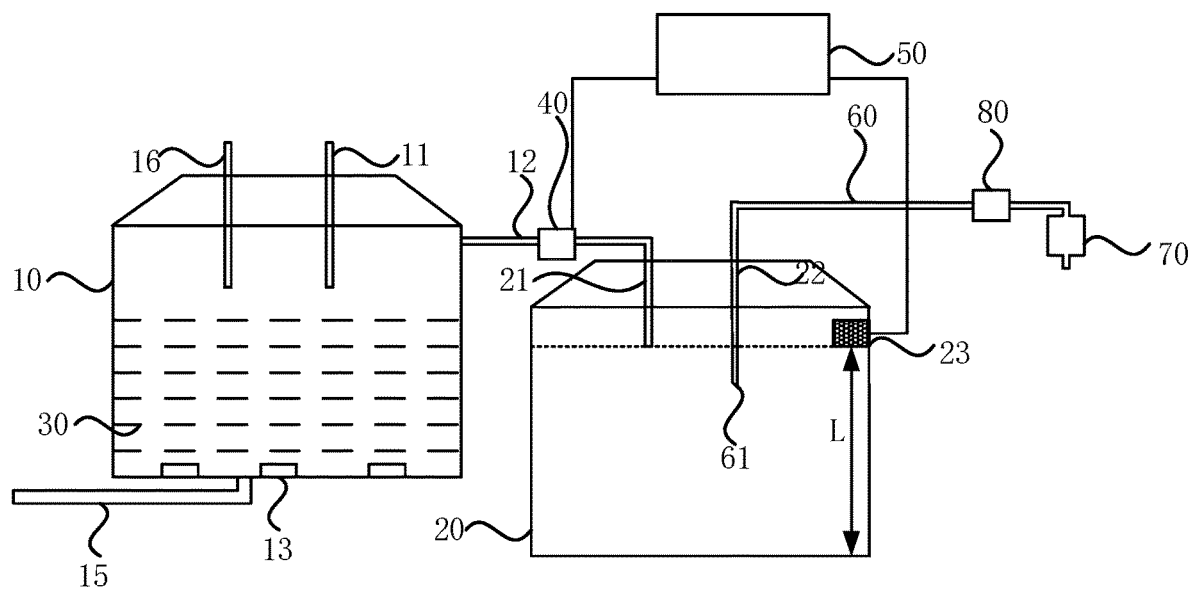
FIG. 5 illustrates a schematic view of a photoresist feeding device according to another example of the present disclosure.

FIG. 5 is a schematic view of a photoresist feeding device according to another example of the present disclosure. In one example, as shown in FIG. 5, a position sensor 23 is provided in the storage member 20, and a first liquid transfer pump 40 is provided between the first photoresist outlet 12 and the second photoresist inlet 21. The photoresist feeding device further includes a controller 50, the position sensor 23 and the first liquid transfer pump 40 are electrically connected with the controller 50. The position sensor 23 is located on a side wall of the storage member 20, and a distance between the position sensor 23 and the bottom of the storage member 20 is a preset height value L. The position sensor 23 is configured to sense whether there is the photoresist solution 30 existed at a location where the position sensor 23 is located. When the position sensor 23 does not sense the photoresist solution 30, the controller 50 controls the first liquid transfer pump 40 to output the photoresist solution 30 into the storage member 20.

It should be noted that the distance between the position sensor 23 and the bottom of the storage member 20 (i.e., the preset height value L) may be adjusted according to an actual requirement, though the application is not limited thereto.

Specifically, according to the embodiment, by arranging the position sensor 23 in the storage member 20, the position sensor 23 senses whether there is the photoresist solution 30 existed at a location where the position sensor 23 is located. When the position sensor 23 does not sense the photoresist solution 30, the position sensor 23 sends a position signal to the controller 50, the controller 50 controls the first liquid transfer pump 40 according to the position signal to output the photoresist solution 30 that has been subjected to the ultrasonic treatment in the cleaning member 10 into the storage member 20, which ensures that the photoresist solution 30 in the storage member 20 is sufficient. As such, it is possible to avoid the situation that a subsequent coating process is affected when the photoresist solution 30 in the storage member 20 is insufficient, and/or the situation that quality of output photoresist solution 30 is affected when the photoresist solution 30 to be output is located in a lower part of the storage member 20 and contains the impurity particles. In addition, according to the present embodiment, by arranging the first liquid transfer pump 40 between the first photoresist outlet 12 and the second photoresist inlet 21, flow rate of the photoresist solution 30 is accelerated, and working speed of a photoetching process is improved.

In one example, as shown in FIG. 5, the photoresist feeding device further includes an output pipe 60 extending into the storage member 20 through the second photoresist outlet 22. A distance between a port 61 of the output pipe 60 extending into the storage member 20 and the bottom of the storage member 20 is less than or equal to the distance between the position sensor 23 and the bottom of the storage member 20.

The output pipe 60 extends into the storage member 20 through the second photoresist outlet 22. The photoresist solution 30 in the storage member 20 is output through the output pipe 60 for the subsequent coating. If the output pipe 60 outputs the photoresist solution 30 when the port 61 of the output pipe 60 in the storage member 20 does not extend into the photoresist solution 30 of the storage member 20, the output photoresist solution 30 may include air, which will affect the quality of the output photoresist solution 30. Therefore, by making the distance between the port 61 of the output pipe 60 in the storage member 20 and the bottom of the storage member 20 to be less than or equal to the distance between the position sensor 23 and the bottom of the storage member 20, the quality of the output photoresist solution 30 is improved, the photoresist solution 30 coated on the object to be coated is more homogeneous, and the yield of the products is improved.

In one example, the photoresist feeding device further includes a nozzle 70 which is connected with the output pipe 60.

According to the present embodiment, the photoresist solution 30 stored in the storage member 20 is coated on the object to be coated through the nozzle 70.

In one example, as shown in FIG. 5, a second liquid transfer pump 80 is arranged on the output pipe 60.

Considering that viscosity of the photoresist solution 30 is generally large and there is generally a large flow resistance for the photoresist solution 30 flowing in the output pipe 60, the second liquid transfer pump 80 is arranged on the output pipe 60, so as to speed up the flow of the photoresist solution 30 to the nozzle 70, to improve the working speed of a photolithographic process.

In one example, as shown in FIG. 1, the cleaning member 10 further includes a bubble discharging port 16 and a particle discharging port 15. The bubble discharging port 16 is located at the top end of the cleaning member 10 and is configured to discharge the bubbles separated from the photoresist solution to be coated on the object to be coated. The particle discharging port 15 is located at the bottom of the cleaning member 10 and is configured to discharge the aggregation of the gathered impurity particles in the photoresist solution 30.

According to the present embodiment, the bubbles separated from the photoresist solution 30 and particulate matter formed by aggregation of the impurity particles in the photoresist solution 30 are discharged through the bubble discharging port 16 and the particle discharging port 15 respectively.

In one example, the bubble discharging port 16 may also be provided with an exhaust valve (not shown in the drawings) to control the opening and closing of the bubble discharging port 16, so as to prevent air from entering into the cleaning member 10.

It should be noted that the above is only a better embodiment of the present disclosure and the technical principle used. Those skilled in the art may understand that the present disclosure is not limited to the specific embodiments described herein, and various obvious variations, readjustments and substitutions may be made by those skilled in the art without departing from the protection scope of the present disclosure. Therefore, although the present disclosure has been described in detail through the above embodiments, the present disclosure is not limited to the above embodiments. Without departing from the concept of the present disclosure, it may also include more other equivalent embodiments, and the scope of the present disclosure is determined by the scope of the appended claims.

What is claimed is:

1. A photoresist feeding device, comprising a cleaning member and a storage member, wherein
   the cleaning member comprises a first photoresist inlet and a first photoresist outlet, the storage member comprises a second photoresist inlet and a second photoresist outlet, the first photoresist outlet is connected with the second photoresist inlet;

a partition member is provided in the cleaning member, the partition member divides a containing cavity of the cleaning member into a first region and a second region, and the first region and the second region are arranged in a direction perpendicular to a bottom of the cleaning member;

the partition member is in a funnel-shape, a central region of the partition member protrudes toward the bottom of the cleaning member, and a hollow structure is located in the central region of the partition member;

an ultrasonic generator is arranged in the bottom of the cleaning member, the ultrasonic generator is configured to generate ultrasonic waves for separating bubbles of a photoresist solution in the cleaning member from the photoresist solution, and for gathering impurity particles in the photoresist solution; and the storage member is configured to store the photoresist solution that has been subjected to ultrasonic treatment.

2. The photoresist feeding device of claim 1, wherein the first photoresist inlet and the first photoresist outlet are located at a top end of the cleaning member; and the second photoresist outlet is located at a top end of the storage member.

3. The photoresist feeding device of claim 1, wherein an area of the hollow structure is S1, and an area of the partition member is S2, and S1=(¼)S2.

4. The photoresist feeding device of claim 1, wherein a position sensor is provided in the storage member, and a first liquid transfer pump is arranged between the first photoresist outlet and the second photoresist inlet;

the photoresist feeding device further comprises a controller, and the position sensor and the first liquid transfer pump are electrically connected with the controller;

the position sensor is located on a side wall of the storage member, and a distance between the position sensor and a bottom of the storage member is a preset height value; and the position sensor is configured to sense whether there is the photoresist solution existed at a location where the position sensor is located; in response to that the position sensor does not sense the photoresist solution, the controller controls the first liquid transfer pump to output the photoresist solution in the cleaning member to the storage member.

5. The photoresist feeding device of claim 4, further comprising an output pipe extending into the storage member through the second photoresist outlet; and a distance between a port of the output pipe extending into the storage member and the bottom of the storage member is less than or equal to the distance between the position sensor and the bottom of the storage member.

6. The photoresist feeding device of claim 5, further comprising a nozzle connected with the output pipe.

7. The photoresist feeding device of claim 5, wherein a second liquid transfer pump is arranged on the output pipe.

8. The photoresist feeding device of claim 1, wherein the cleaning member further comprises a bubble discharging port and a particle discharging port; the bubble discharging port is located at a top end of the cleaning member and is configured to discharge the bubbles separated from the photoresist solution; and the particle discharging port is located at the bottom of the cleaning member and configured to discharge an aggregation of the gathered impurity particles in the photoresist solution.

9. The photoresist feeding device of claim 1, wherein the first photoresist outlet is arranged at an upper part of a side wall of the cleaning member, and the second photoresist outlet is arranged at a top surface of the storage member.

10. The photoresist feeding device of claim 1, wherein the first photoresist outlet is arranged at a top surface of the cleaning member, and the second photoresist outlet is arranged at an upper part of a side wall of the storage member.

11. The photoresist feeding device of claim 8, wherein the bubble discharging port is provided with an exhaust valve to control an opening and closing of the bubble discharging port.

* * * * *